(12) United States Patent
Prentice (10) Patent No.: US 6,570,427 B2
(45) Date of Patent: May 27, 2003

(54) VARIABLE TRANSCONDUCTANCE AMPLIFIER

(75) Inventor: John S. Prentice, Palm Bay, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/943,668

(22) Filed: Aug. 31, 2001

(65) Prior Publication Data

US 2003/0071286 A1 Apr. 17, 2003

Related U.S. Application Data (60) Provisional application No. 60/257,763, filed on Dec. 21, 2000.

(51) Int. Cl.[7] ............................................... H03H 11/26
(52) U.S. Cl. ...................................... 327/287; 327/280
(58) Field of Search .......................... 257/212; 330/253, 330/260, 252, 255, 257, 301, 85, 292, 341; 327/53, 51, 52, 563, 89, 96, 127, 246, 266, 274, 280, 287, 359

(56) References Cited

U.S. PATENT DOCUMENTS

| | | | | |
|---|---|---|---|---|
| 4,931,746 A | * | 6/1990 | Trankle et al. | 330/254 |
| 5,774,020 A | * | 6/1998 | Kimura | 330/252 |
| 6,005,439 A | * | 12/1999 | Fong | 330/253 |
| 6,118,340 A | * | 9/2000 | Koen | 330/253 |

FOREIGN PATENT DOCUMENTS

| | | | |
|---|---|---|---|
| JP | 406303051 A | * | 10/1994 |

OTHER PUBLICATIONS

Adel S. Sedra and Kenneth C. Smith, Microelectronic Circuits 1998, Oxford University Press, 4th edition, p. 222.*

* cited by examiner

Primary Examiner—Olik Chaudhuri
Assistant Examiner—Dana Farahani
(74) Attorney, Agent, or Firm—Gary R. Stanford (57) ABSTRACT

A variable transconductance amplifier including a variable attenuator stage coupled to a transconductance stage. The variable attenuator includes first and second differential to single-ended transconductance stages, each biased by a current device. The variable attenuator receives a differential input voltage signal and develops a current signal. At least one reactive element is coupled between the pair of differential to single-ended transconductance stages. The transconductance stage includes first and second differential pairs each having first and second control terminals and first and second output terminals. The first and second differential pairs are coupled to the first and second differential to single-ended transconductance stages, respectively, of the variable attenuator. The output terminals of the first and second differential pair are cross-coupled to develop a differential output current signal. The stages include electronically controllable current devices so that the overall transconductance decreases when the input signal increases without distorting the output signal.

33 Claims, 7 Drawing Sheets

VARIABLE TRANSCONDUCTANCE AMPLIFIER

CROSS-REFERENCE TO RELATED APPLICATION(S)

The present application is based on U.S. Provisional Patent Application entitled "Variable Transconductance Amplifier", Ser. No. 60/257,763, filed Dec. 21, 2000, which is hereby incorporated by reference in its entirety. The present application is related to U.S. Patent Application entitled "A Calibrated DC Compensation System For A Wireless Communication Device Configured In A Zero Intermediate Frequency Architecture", Ser. No. 09/677,975, filed Oct. 2, 2000, which is hereby incorporated by reference in its entirety.

FIELD OF THE INVENTION

The present invention relates to filters, converters and amplifiers, and more particularly to a variable transconductance amplifier with improved linearity and that maximizes input voltage utilization.

DESCRIPTION OF RELATED ART

The bipolar junction transistor (BJT) differential pair is one of the most important integrated circuit building blocks. It can be used as a transconductance stage for variable gain amplifiers and $g_m$-C filters. The differential output current $I_D$ is related to the emitter bias current $I_E$ and the input differential voltage $V_{Dif}$ in accordance with the following equation 1:

$$I_D \sim I_E \tan h[V_{Dif}/2V_T] \sim (I_E/2V_T)V_{Dif} \qquad (\text{EQ 1})$$

where "~" denotes "approximately equal" and where $V_T$ is a thermal coefficient voltage (the voltage equivalent of temperature, where $V_T=kT/q$, where "k" is the Boltzmann constant in joules per degree Kelvin, T is the temperature in degrees Kelvin [absolute scale], and "q" is the magnitude of the charge of an electron), and when $V_{Dif} < V_T$.

The transconductance ($g_m$), which is the ratio of output current to input voltage, can be scaled by changing the emitter bias current. The only major problem with this stage is the maximum useful input voltage. Significant distortion occurs when the peak input voltage is in excess of about $2V_T$. Linearity can be improved by adding resistive or inductive emitter degeneration, but then the transconductance cannot be changed electronically.

Prior art approaches to increasing the allowable input voltage (over that of a single differential pair) include dividing the input voltage across series-connected differential pairs or using an attenuator in front of the differential pair(s). The attenuator usually has low input impedance and does not lend itself to electronic gain control. The series-connected differential pairs (multi-tanh) becomes impractical for large input voltages, where "tanh" refers to the hyperbolic tangent function.

SUMMARY OF THE INVENTION

A variable transconductance amplifier according to the present invention includes a variable attenuator stage coupled to a transconductance stage. The variable transconductance amplifier allows the overall transconductance to be decreased when the input signal is increased without distorting the output signal. Embodiments of the variable attenuator stage described herein exhibit a relatively high input impedance and are electronically controllable. Embodiments of the transconductance stage also have electronically controllable gain. In this manner, electronic gain control can be applied to either or both stages so that attenuation may be increased in the presence of increasing input voltage to maintain linearity. In various embodiments described herein, electronic gain control is achieved using electronically controllable current devices, such as current sinks or current sources, that may be controlled by external circuitry as is known to those skilled in the electronic arts.

In a particular embodiment, the variable attenuator includes first and second differential to single-ended transconductance stages, where each stage is biased by a respective one of first and second current devices. Also, each stage has a first control terminal, so that both stages collectively receive a differential input voltage signal. Each stage further has a second control terminal that develops a current signal. At least one reactive element or a reactive circuit is coupled between the second control terminals of the pair of differential to single-ended transconductance stages, so that the developed current signal flows through this element or circuit. In this embodiment, the transconductance stage includes a first differential pair having first and second control terminals and first and second output terminals, where the first and second control terminals of the first differential pair are coupled to the first and second control terminals, respectively, of the first differential to single-ended transconductance stage of the variable attenuator. The transconductance stage further includes a second differential pair having first and second control terminals and first and second output terminals, where the first and second control terminals of the second differential pair are coupled to the first and second terminals, respectively, of the second differential to single-ended transconductance stage of the variable attenuator. The first output terminal of the first differential pair is coupled to the second output terminal of the second differential pair and forms a first polarity of a differential output current signal. Also, the first output terminal of the second differential pair is coupled to the second output terminal of the first differential pair and forms a second polarity of the differential output current signal.

The particular configuration of the reactive element depends upon the specific application in which the variable transconductance amplifier is employed. In one embodiment, a single resistor may be used. In alternative embodiments, an inductor, a capacitor, or any combination of such components may be employed as appropriate for the specific application and signal frequency. For example, the combination of components may have a characteristic frequency or frequency response designed for specific applications.

The first and second current devices may be electronically controllable to adjust the gain of the variable attenuator and to adjust the maximum allowable input voltage of the differential input voltage while maintaining linearity. In a similar manner, the first and second differential pairs may each be biased by at least one additional current device that is electronically controllable to adjust the transconductance between the differential input voltage signal and the differential output current signal. In one embodiment, the first and second differential pairs of the transconductor stage may each have a bias terminal, where the bias terminals of the first and second differential pairs may be coupled together. Also, a third current device may be coupled to the common bias terminals of the first and second differential pairs. This third current device may be electronically controllable as the first and second current devices.

In one alternative embodiment of the variable attenuator, each differential to single-ended transconductance stage includes a differential pair of transistors including a diode-coupled transistor, a current sink and a current mirror coupled to the differential pair. In another alternative embodiment of the variable attenuator, each differential to single-ended transconductance stage includes a differential pair of transistors including a first transistor coupled to a voltage supply signal and a diode-coupled transistor. The first and second current devices are each current sinks coupled to a respective one of the differential pairs. Also, for each differential pair, a current source is coupled to the diode-coupled transistor, where the current source sources a current level that is proportional to the current developed by the corresponding current sink of the differential pair.

In yet another embodiment, first and second current sources are provided for each differential pair, where each is coupled to source current to a respective one of the transistors of the differential pair. In this latter configuration, the current sources each source a current that is proportional to the current developed by a corresponding current sink of the differential pair. In yet another alternative embodiment, the differential pairs of transistors of the first and second differential to single-ended transconductance stages are cross-coupled. Capacitors may be added in the cross-coupled configuration to facilitate operation at higher frequencies.

Many variations are possible for each of the variable attenuator and transconductance stages of the variable transconductance amplifier. For example, different types of transistors may be used, such as NPN or PNP bipolar junction transistors, metal-oxide semiconductor, field-effect transistors (MOSFETs), etc. The current mirrors, for example, may be configured using common base PNP bipolar junction transistors as known to those skilled in the art. Current mirrors, if used, may have a 1:1 current ration or any other desirable current ratio. The relative current levels between corresponding current sources and current sinks of each portion of each stage may be altered if desired for certain configurations. The transistors of each transistor pair or differential pair configuration may have different sizes, emitter areas, current capacities, etc. Level shifting elements may be added if desired, such as for configurations required to handle large input voltages that might otherwise drive certain transistors into saturation. For example, diodes may be connected in series with the bases of selected bipolar junction transistors. For high frequency operation, capacitors may be coupled between the each of the first and second differential to single-ended transconductance stages of the variable attenuator and the reactive element.

BRIEF DESCRIPTION OF THE DRAWINGS

A better understanding of the present invention can be obtained when the following detailed description of embodiments of the invention is considered in conjunction with the following drawing, in which.

DETAILED DESCRIPTION OF EMBODIMENT(S) OF THE INVENTION

Figure 1:
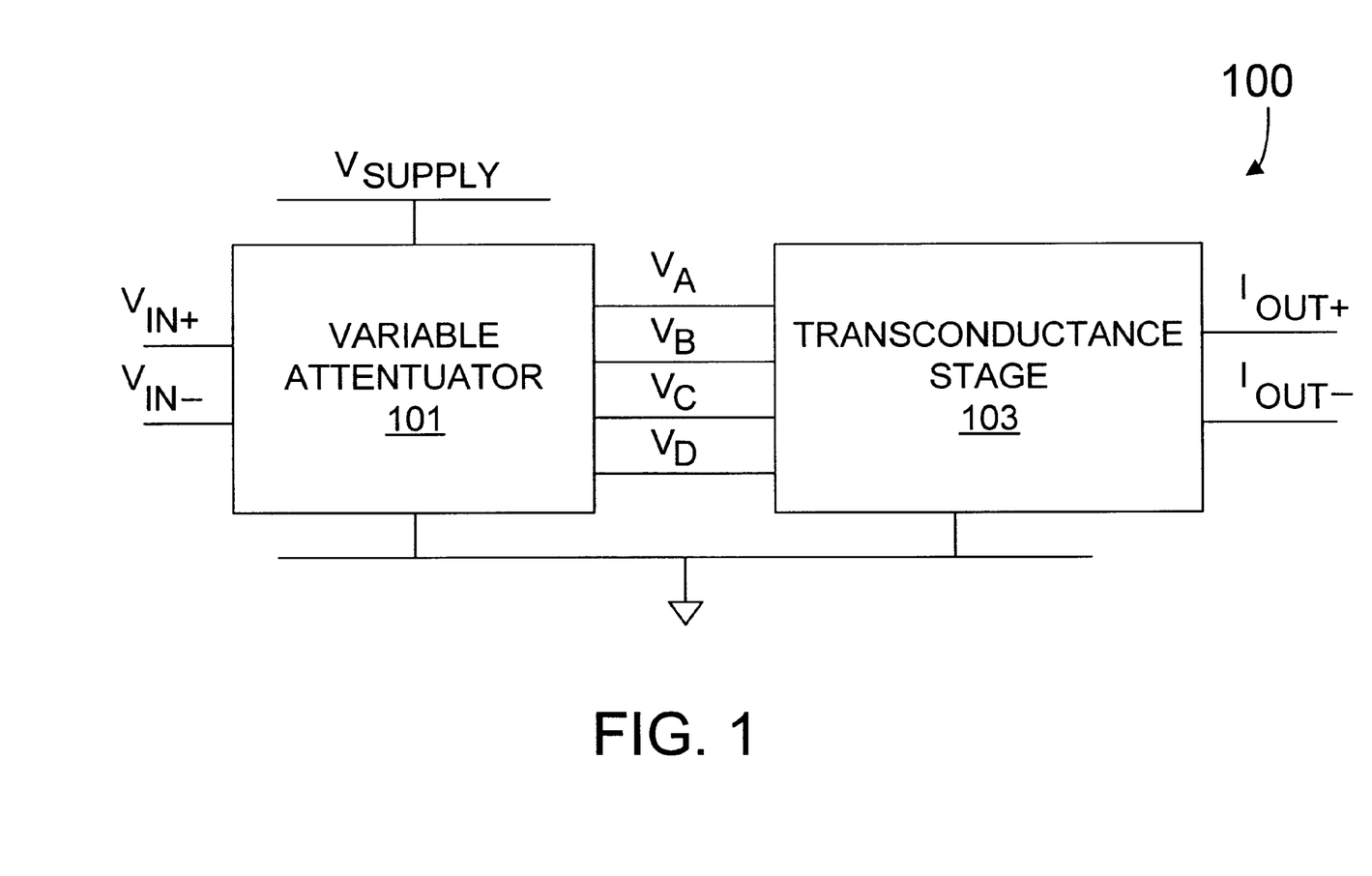
FIG. 1 is a block diagram of an exemplary variable transconductance amplifier in accordance with an embodiment of the present invention including a variable attenuator coupled to a transconductance stage.

FIG. 1 is a block diagram of an exemplary variable transconductance amplifier 100 in accordance with an embodiment of the present invention. The transconductance amplifier 100 includes a first stage variable attenuator 101 that reduces the voltage applied to a second transconductance stage 103. Electronic gain control is applied to either or both the variable attenuator 101 and the transconductance stage 103. The attenuation may be increased in the presence of increasing input voltage to maintain linearity. The variable attenuator 101 is referenced between a voltage supply signal $V_{Supply}$ and a common reference signal, such as ground, and receives a differential input voltage $V_{IN}$ having differential polarity signals $V_{IN+}$ and $V_{IN-}$. It is appreciated that any suitable reference signal is contemplated, including ground. The variable attenuator 101 establishes four voltage signals $V_A$, $V_B$, $V_C$ and $V_D$ (having voltages of $V_A$, $V_B$, $V_C$ and $V_D$, respectively) to the transconductance stage 103, which generates a differential output current $I_{OUT}$ having differential polarity output current signals $I_{OUT+}$ and $I_{OUT-}$.

Figure 2:
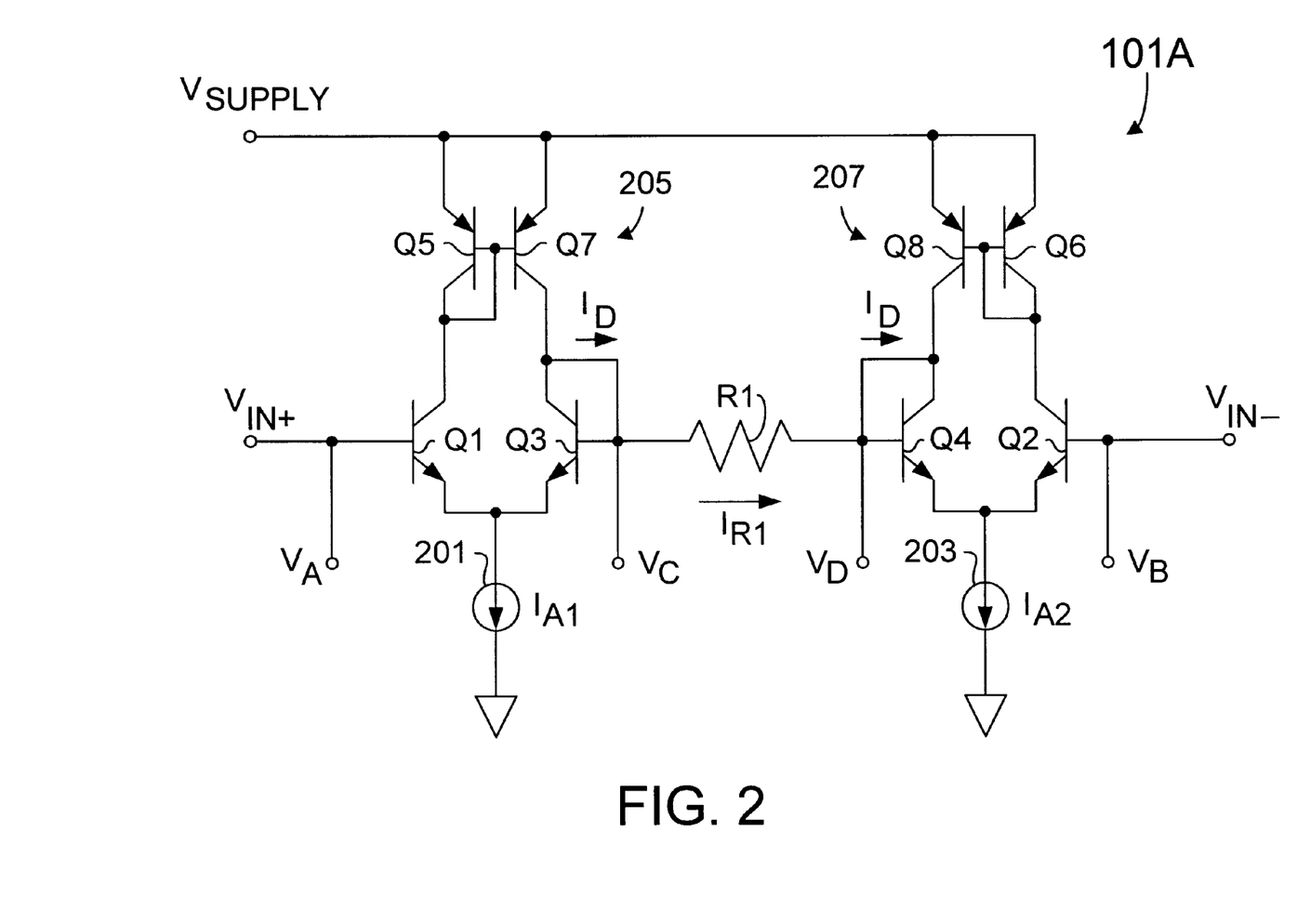
FIG. 2 is a schematic diagram of an exemplary variable attenuator that may be used as the variable attenuator of FIG. 1.

FIG. 2 is a schematic diagram of an exemplary variable attenuator 101A that may be used as the variable attenuator 101. The variable attenuator 101A includes NPN bipolar junction transistors (BJTs) Q1–Q4, PNP BJTs Q5–Q8, a resistor R1 and two constant current supplies or sinks 201, 203. The current sink 201 draws a current $I_{A1}$ and the current sink 203 draws a current $I_{A2}$. The emitters of the transistors Q5–Q8 are coupled to the $V_{Supply}$ signal. The bases of the transistors Q5 and Q7 are coupled together and the base of the transistor Q5 is coupled to its collector. In a similar manner, the bases of the transistors Q6 and Q8 are coupled together and the base of the transistor Q6 is coupled to its collector.

The collectors of the transistors Q5, Q7, Q8 and Q6 are coupled to the collectors of the transistors Q1, Q3, Q4 and Q2, respectively. The emitters of the transistors Q1 and Q3 are coupled together and to one end of the current sink 201, having its other end coupled to ground. The emitters of the transistors Q2 and Q4 are coupled together and to one end of the current sink 203, having its other end coupled to ground. The bases of the transistors Q1 and Q2 received the $V_{IN+}$ and $V_{IN-}$ signals, respectively, which are the same as the $V_A$ and $V_B$ signals, respectively. The bases of the transistors Q3 and Q4 develop the $V_C$ and $V_D$ signals, respectively. The resistor R1 is has one end coupled to the base of the transistor Q3 and its other end coupled to the base of the transistor Q4. A current $I_D$ is defined as flowing from the collector to the base of the transistor Q3 and is the same current flowing from the base to the collector of the transistor Q4. A current $I_{R1}$ is defined as flowing through the resistor R1 between the $V_C$ and $V_D$ signals.

The four output voltages $V_A$–$V_D$ are a function of the differential input voltage $V_{IN}$ with the $V_A$ and $V_B$ signals being the same as the two $V_{IN+}$ and $V_{IN-}$ input signals. There are two differential pairs of transistors, Q1, Q3 and Q2, Q4, connected to each end of the resistor R1. In the embodiment shown, the transistors Q1–Q4 are substantially identical. The transistors Q3 and Q4 are diode connected, having their bases and collectors shorted together. The transistors Q5 and Q7 are configured as a first current mirror 205 and the transistors Q6 and Q8 are configured as a second current mirror 207. In this manner, the collectors of the transistors Q1 and Q2 are connected to the inputs of the current mirrors 205 and 207 with the current mirror outputs connected to the collectors of the transistors Q3 and Q4. The current mirrors 205 and 207 are shown as PNP transistors but may be implemented with any other current mirror configuration. For example, the current mirrors 205 and 207 may be implemented using other types of transistors, such as PMOS transistors or the like. Also, in the embodiment shown the current mirrors 205 and 207 have an output/input ratio of 1:1, the current sources 201 and 203 are assumed to be matched, and the base currents are assumed to be negligible.

The combination of a differential pair of transistors Q1 and Q3 with the first current mirror 205 forms a differential-to single-ended transconductance stage with an output current ($I_D$) equal to the differential current out of the differential pair. This current also flows through the resistor R1 ($I_{R1}$), and is defined according to the following equation 2:

$$I_D = I_{R1} = I_A \tan h[(V_A - V_C)/2V_T] = I_A \tan h[(V_D - V_B)/2V_T], \quad (EQ\ 2)$$

where $I_{A2} = I_{A1} = I_A$. The differential input voltage is equal to the current-resistive (IR) drop across the resistor R1 plus the two differential input voltages of the two differential pairs as illustrated in the following equations 3 and 4:

$$V_{IN+} - V_{IN-} = (V_A - V_C) + (I_D)R1 + (V_D - V_B) = 2(V_A - V_C) + (I_A)(R1)\tan h[(V_A - V_C)/2V_T] \quad (EQ\ 3)$$

$$V_{IN+} - V_{IN-} \approx 2(V_A - V_C) + [(I_A)(R1)/2V_T](V_A - V_C) = (V_A - V_C)(2 + [(I_A)(R1)/2V_T]) \quad (EQ\ 4)$$

where $|(V_A - V_C)| < V_T$. The following equation 5 is the attenuator transfer function showing that the voltage applied to either differential pair is a fraction less than or equal to one-half of the input voltage:

$$(V_A - V_C) = (V_{IN+} - V_{IN-})(2V_T/[4V_T + (I_A)(R1)]) \quad (EQ\ 5)$$

where, again, $|(V_A - V_C)| < V_T$. This fraction becomes smaller as the bias current $I_A$ gets larger. This fraction is independent of temperature when $I_A$ is made Proportional To Absolute Temperature (PTAT). The following equation 6 shows the conditions for linear operation:

$$|(V_A - V_C)| < V_T \Rightarrow |(V_{IN+} - V_{IN-})| < (2V_T + (I_A)(R1)/2) \quad (EQ\ 6)$$

The maximum input voltage may be increased if the current $I_A$ is increased. Increasing $I_A$ also increases the amount of attenuation.

Figure 3:
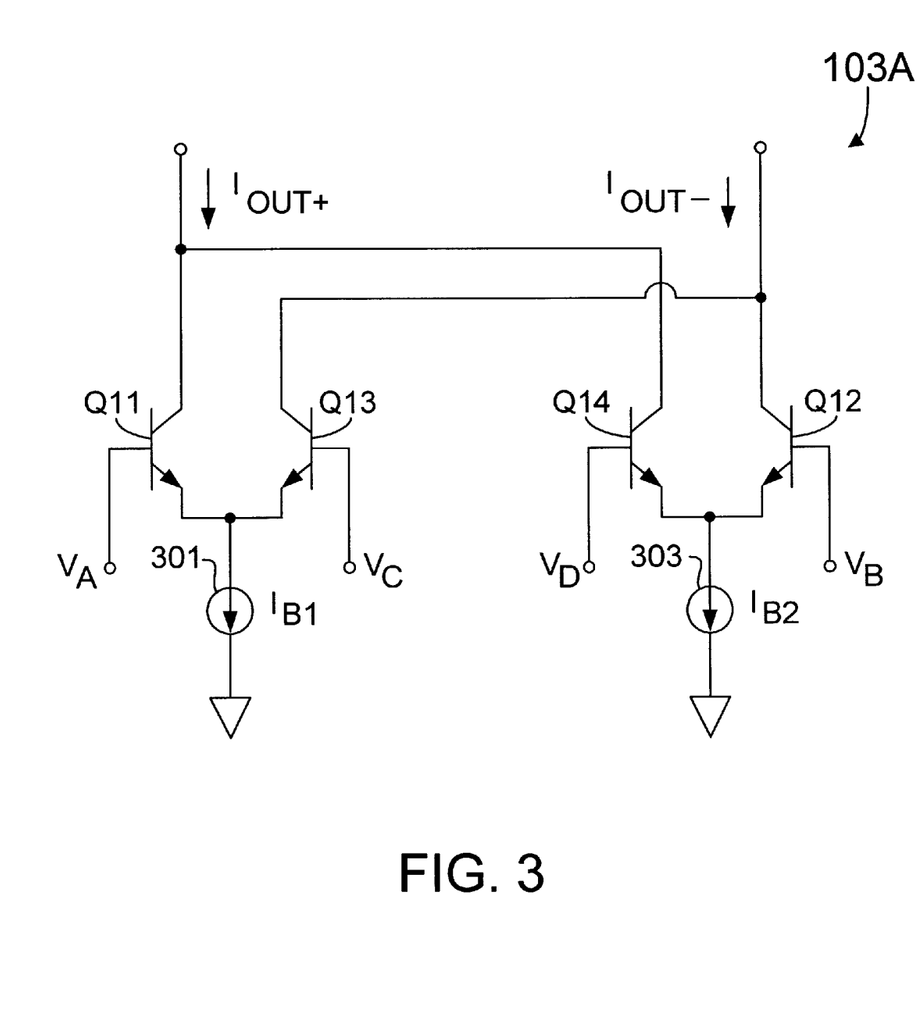
FIG. 3 is a schematic diagram of an exemplary transconductance stage that may be used as the transconductance stage of FIG. 1.

FIG. 3 is a schematic diagram of an exemplary transconductance stage 103A that may be used as the transconductance stage 103. The transconductance stage 103A includes four NPN BJTs Q11, Q12, Q13 and Q14 and two current sinks 301 and 303. The transistors Q11 and Q13 are coupled together at their emitters and to one end of the current sink 301 that sinks a current of $I_{B1}$. The transistors Q12 and Q14 are coupled together at their emitters and to one end of the current sink 303 that sinks a current of $I_{B2}$. The current sinks 301, 303 are also coupled to ground. The $V_A$–$V_D$ signals are provided to the bases of the transistors Q11–Q14, respectively. The collectors of the transistors Q11 and Q14 are coupled together and develop the $I_{OUT+}$ output signal. The collectors of the transistors Q12 and Q13 are coupled together and develop the $I_{OUT-}$ output signal. Since the four outputs from the variable attenuator 101 are the four input signals to the transconductance stage ($V_A$, $V_B$, $V_C$ and $V_D$), the following equation 7 describes the differential output current $I_{OUT}$:

$$(I_{OUT+} - I_{OUT-}) = I_{B1} \tan h[(V_A - V_C)/2V_T] + I_{B2} \tan h[(V_D - V_B)/2V_T] = 2I_B \tan h[(V_A - V_C)/2V_T] \quad (EQ\ 7)$$

where $I_{B2} = I_{B1} = I_B$. Substituting the attenuator transfer function (EQ 5) into the transconductance function above, yields the following equation 8:

$$(I_{OUT+} - I_{OUT-}) = 2(I_B/I_A)I_{R1} = (I_B/V_T)(V_A - V_C) = (V_{IN+} - V_{IN-})(2I_B)/[4V_T + (I_A)(R1)] \quad (EQ\ 8)$$

where $|(V_A - V_C)| < V_T$. The transconductance $g_m$ of the transconductance amplifier 100 employing the variable attenuator 101A and the transconductance stage 103A is defined according to the following equation 9:

$$g_m = (I_{OUT+} - I_{OUT-})/(V_{IN+} - V_{IN-}) = 2(I_B)/[4V_T + (I_A)(R1)] \quad (EQ\ 9)$$

The differential output current is proportional to the current $I_{R1}$ flowing through the resistor R1. The transconductance can be varied by changing either the bias current to the transconductance stage ($I_B$) or the bias current to the variable attenuator stage ($I_A$) or by varying both.

Figure 4:
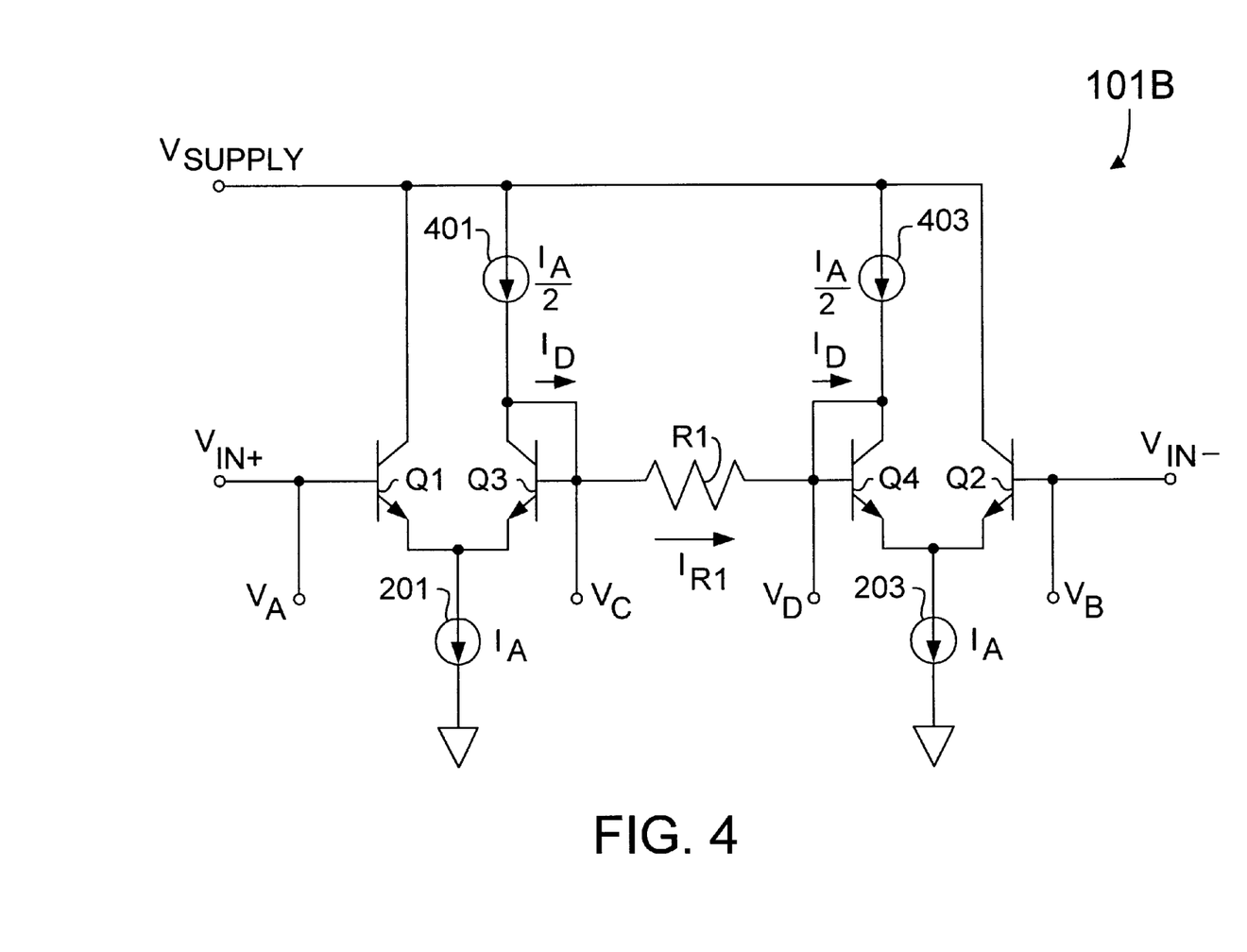
FIG. 4 is a schematic diagram of another exemplary variable attenuator that may be used as the variable attenuator of FIG. 1.

FIG. 4 is a schematic diagram of another exemplary variable attenuator 101B that may be used as the variable attenuator 101. The variable attenuator 101B is similar to the variable attenuator 101A except that the transistors Q5–Q7 are removed. The current sinks 201 and 203 are shown as both providing a current $I_A$ (where $I_A$ may be equal to $I_{A1}$ and $I_{A2}$). Also, the collectors of the transistors Q1 and Q2 are coupled to the $V_{Supply}$ signal. Finally, two current sources 401 and 403 are added, each having one end coupled to the $V_{Supply}$ signal and another end coupled to a respective collector of the transistors Q3 and Q4. Each of the current sources 401 and 403 source a current of $I_A/2$ into the respective collectors of the transistors Q3 and Q4. It is noted that for high frequency applications, PNP or PMOS current mirrors may not have the signal bandwidth, so that current sources may be used as shown in FIG. 4.

The combination of the differential pair of transistors Q1 and Q3 with the current source 401 forms a differential- to single-ended transconductance stage, with an output current ($I_D$) equal to half of the differential current out of the differential pair. The current $I_D$ also flows through the resistor R1 as illustrated by the following equation 10:

$$I_D = I_{R1} = (I_A/2)\tan h[(V_A - V_C)/2V_T] = (I_A/2)\tan h[(V_D - V_B)/2V_T] \quad (EQ\ 10)$$

The differential input voltage $V_{IN}$ is equal to the IR drop across the resistor R1 plus the two differential input voltages of the two differential pairs as illustrated by the following equations 11 and 12:

$$V_{IN+} - V_{IN-} = (V_A - V_C) + (I_D)R1 + (V_D - V_B) = 2(V_A - V_C) + (I_A/2)(R1)\tan h[(V_A - V_C)/2V_T] \quad (EQ\ 11)$$

$$V_{IN+} - V_{IN-} \approx 2(V_A - V_C) + [(I_A)(R1)/4V_T](V_A - V_C) = (V_A - V_C)(2 + [(I_A)(R1)/4V_T]) \quad (EQ\ 12)$$

where $|(V_A - V_C)| < V_T$. The voltage differential $V_A - V_C$ is defined according to the following equation 13:

$$(V_A - V_C) = (V_{IN+} - V_{IN-})(4V_T/[8V_T + (I_A)(R1)]) \quad (EQ\ 13)$$

where $|(V_A - V_C)| < V_T$. Thus, the current passing through the resistor R1 is half as large, so that the IR voltage drop is also half.

It is noted that the above discussion assumes that the current sources 401, 403 at the collectors of Q3 and Q4 track the current sinks 201, 203 at the emitters. These currents $I_A$ and $I_A/2$ are varied together for the electronic gain control. One practical way to do this is to use the current mirror arrangement of the variable attenuator 101A, with current mirrors that do not respond to the signal, i.e., the current mirror frequency response is much lower than that of the signal.

Figure 5:
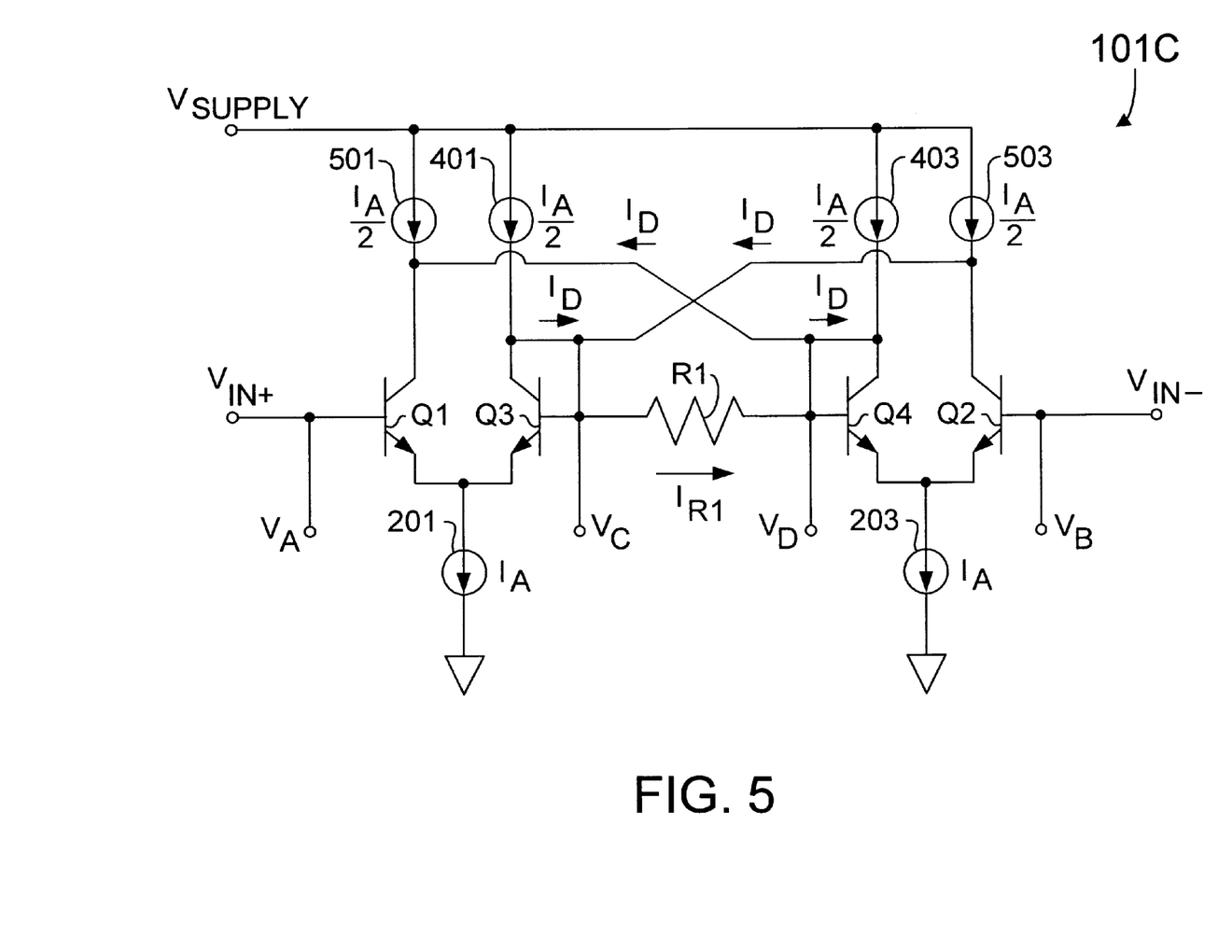
FIG. 5 is a schematic diagram of another exemplary variable attenuator that may be used as the variable attenuator of FIG. 1.

FIG. 5 is a schematic diagram of another exemplary variable attenuator 101C that may be used as the variable attenuator 101. Under some circumstances, the collector currents of the transistors Q1 and Q2 can be used without current mirrors. The variable attenuator 101C is similar to the variable attenuator 101B with two additional current sources 501 and 503, each coupled between the $V_{Supply}$ signal and the collector of a respective one of the transistors Q1 and Q2, and each sourcing a current of $I_A/2$. Also, a cross-coupled connection is made where the collector of the transistor Q1 is coupled to the collector of the transistor Q4 and the collector of the transistor Q2 is coupled to the collector of the transistor Q3. A current equal to $I_D$ flows from the collector of the transistor Q2 to the collector of the transistor Q3. Also, another current equal to $I_D$ flows from the collector of the transistor Q4 to the collector of the transistor Q1.

The combination of the differential pair of transistors Q1 and Q3 with the current sources 401 and 501 forms a differential- to single-ended transconductance stage with two output currents ($I_D$), each equal to half of the differential current out of the differential pair. These output currents are 180 degrees out of phase and are connected to opposite ends of the resistor R1. The current through the resistor R1 for the variable attenuator 101C is defined by the following equation 14:

$$I_{R1}=2I_D=I_A \tan h[(V_A-V_C)/2V_T]=I_A \tan h[(V_D-V_B)/2V_T] \quad \text{(EQ 14)}$$

The differential input voltage is equal to the IR drop across the resistor plus the two differential input voltages of the two differential pairs as illustrated by the following equations 15 and 16:

$$V_{IN+}-V_{IN-}=(V_A-V_C)+(I_D)R1+(V_D-V_B)=2(V_A-V_C)+(I_A)(R1)\tan h[(V_A-V_C)/2V_T] \quad \text{(EQ 15)}$$

$$V_{IN+}-V_{IN-}=2(V_A-V_C)+[(I_A)(R1)/2V_T](V_A-V_C)=(V_A-V_C)(2+(I_A)(R1)/2V_T) \quad \text{(EQ 16)}$$

where $\square(V_A-V_C)\square<V_T$. Solving for $V_A-V_C$ results in the following equation 17:

$$(V_A-V_C)=(V_{IN+}-V_{IN-})(2V_T/[4V_T+(I_A)(R1)]) \quad \text{(EQ 17)}$$

where $\square(V_A-V_C)\square<V_T$. The current passing through the resistor R1 is the same as the current mirror version, or the variable attenuator 101A. The voltage drop across the resistor R1 appears across the base-collector junctions of the transistors Q1 and Q2. If the variable attenuator 101C is required to handle large input voltages, the transistors Q1 and Q2 could be driven into saturation unless appropriate level shifting elements are added. For example, in an alternative embodiment, diodes (not shown) are connected in series with the bases of the transistors Q3 and Q4. For high frequency operation, the collectors of the transistors Q1 and Q2 may be coupled to the resistor R1 through capacitors (not shown).

Figure 6:
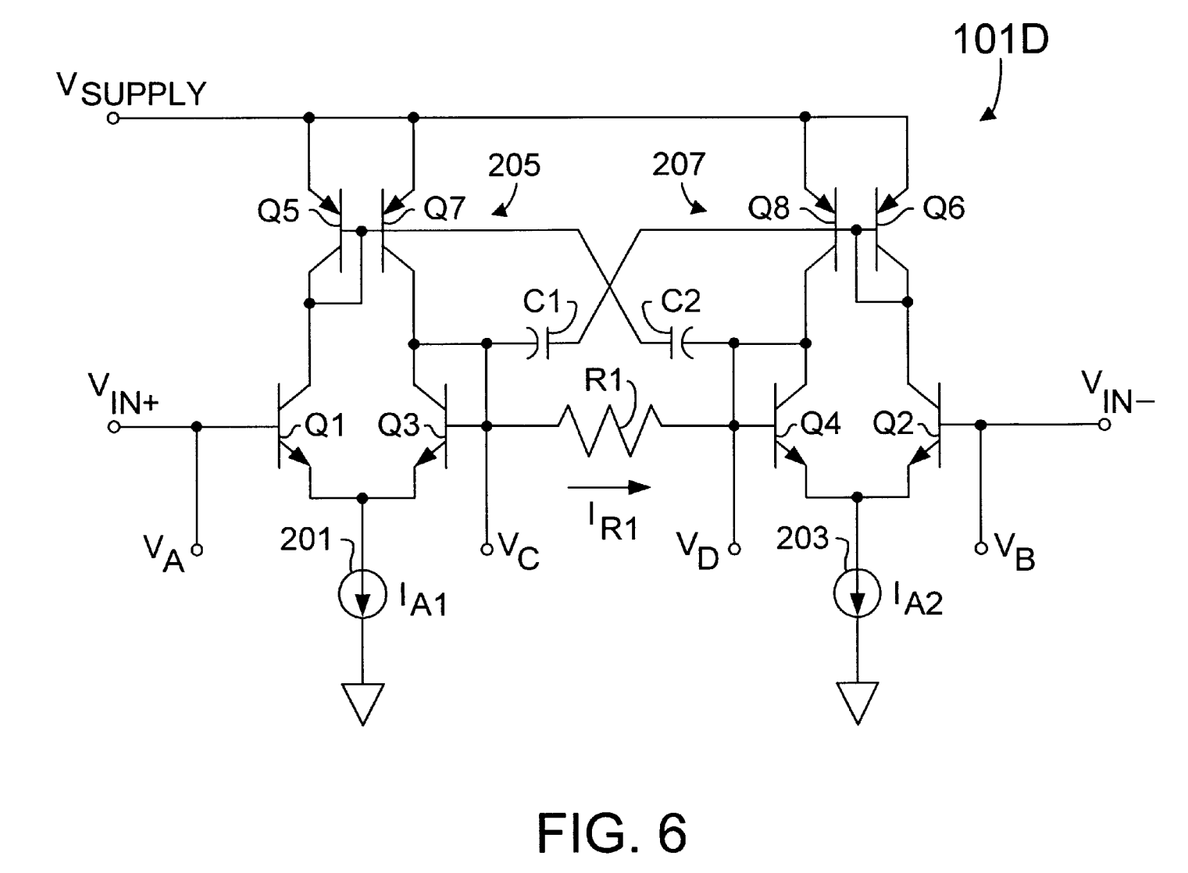
FIG. 6 is a schematic diagram of another exemplary variable attenuator that may be used as the variable attenuator of FIG. 1.

FIG. 6 is a schematic diagram of another exemplary variable attenuator 101D that may be used as the variable attenuator 101. For high frequency operation, the collectors of the transistors Q1 and Q2 are coupled to the resistor R1 through capacitors C1 and C2, which are used in conjunction with a slow current mirror circuit. The variable attenuator 101D is similar to the variable attenuator 101A, except that a capacitor C1 is coupled between the base of the transistor Q8 and the collector of the transistor Q3. Also, a capacitor C2 is coupled between the base of the transistor Q7 and the collector of the transistor Q4. The current sinks 201, 203 are shown as sinking currents $I_{A1}$ and $I_{A2}$, respectively.

At low frequencies, the collector currents of the transistors Q1 and Q2 are mirrored by the current mirrors 205 and 207, respectively, and are subtracted from the collector currents of the transistors Q3 and Q4, respectively. At high frequencies, the collector currents of the transistors Q1 and Q2 go through the capacitors C2 and C1, respectively, and are added to the collector currents from the transistors Q4 and Q3, respectively. The current through the resistor R1 does not change with frequency.

There are many other variations that are possible and contemplated for the variable attenuator 101. The resistor R1 may instead be an inductor, a capacitor or some other combination of components as appropriate for the specific application and signal frequency. The transistors Q1 and Q3 may have the same or different emitter areas. Current mirrors, if used, may have a current mirror ratio different than 1:1. The transistors Q1–Q4 may be replaced by other types of transistor devices, such as metal oxide semiconductor field effect transistors (MOSFETs) or the like or other active devices. Also, PNPs may be substituted for NPNs and vice-versa.

Figure 7:
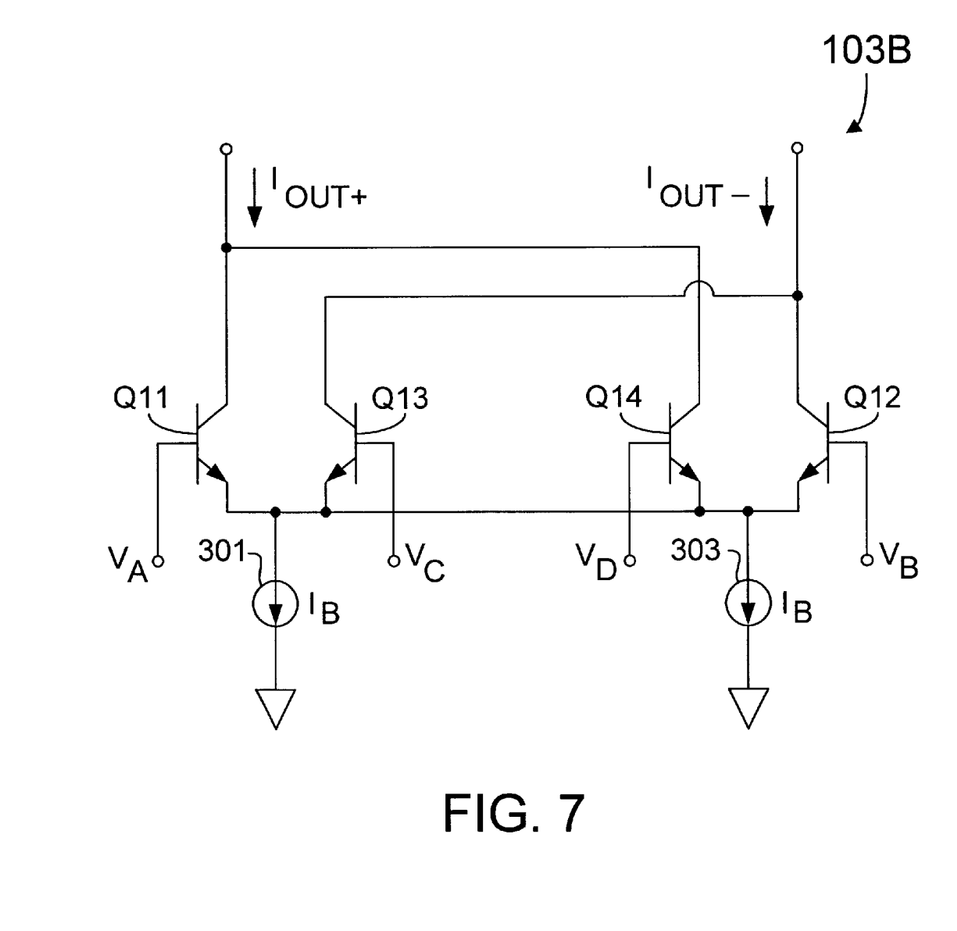
FIG. 7 is a schematic diagram of an exemplary transconductance stage that may be used as the transconductance stage of FIG. 1.

FIG. 7 is a schematic diagram of another exemplary transconductance stage 103B that may be used as the transconductance stage 103. The transconductance stage 103B is very similar to the transconductance stage 103A, except that the emitters of the transistors Q11–Q14 are all coupled together and the current sinks 301 and 303 each sink a current of $I_B$ (where $I_B$ may be equal to $I_{B1}$ and $I_{B2}$).

The output current of the transconductance stage 103B is substantially identical to that of the transconductance stage 103A. The two current sources 301 and 303 may be combined into a single source of twice the value. For an input differential voltage of zero, so that $V_A=V_B=V_C=V_D$, the current divides equally between the four transistors Q11–Q14 and the differential output current $I_{OUT}$ is also zero. For a large positive input voltage, the transistors Q12 and Q14 are cut off so that the differential current is provided by the following equation 18:

$$(I_{OUT+}-I_{OUT-})=2(I_B)\tan h[(V_A-V_C)/2V_T] \quad \text{(EQ 18)}$$

where $V_C-V_D>2V_T$. For large negative voltages, the transistors Q11 and Q13 are cut off. Redefining the currents $I_{B1}$ and $I_{B2}$ as the currents flowing into the emitters of the differential pairs of transistors Q11, Q13 and Q12, Q14, respectively, then the differential output current is provided by the following equation 19:

$$(I_{OUT+}-I_{OUT-})=I_{B1} \tan h[(V_A-V_C)/2V_T]+I_{B2} \tan h[(V_D-V_B)/2V_T]=2(I_B)\tan h[(V_A-V_C)/2V_T] \quad \text{(EQ 19)}$$

where $I_{B2}=I_{B1}=2I_B$, and $V_A-V_C=V_D-V_A$, which is the same as EQ 7. If the circuit works the same with either an open or short between the pairs of emitters (the two current sources), then it works with any two terminal elements connecting the pairs of emitters.

There are also many other variations that are possible and contemplated for the transconductance stage 103. For example, the emitter areas of the transistors Q11 and Q13 may be equal, although they do not have to be equal. The transistors Q11–Q14 may be replaced by other types of transistors, such as MOSFETs or the like, or by other active devices. Also, PNPs may be substituted for NPNs.

The variable transconductance amplifier described herein provide many benefits and advantages over transconductance amplifiers previously available. The attenuator, and the entire amplifier, has a relatively high input impedance so that it may easily be driven by a low impedance source. The attenuator embodiments are each variable in that the gain is variable and may be electronically controlled. For example, the current sinks 201 and 203 defining the bias current may each be readily implemented in an electronically controllable manner so that the attenuator gain may be variable and controllable as desired. Increasing the bias current increases the maximum input voltage of the differential input voltage $V_{IN}$ while still maintaining linearity. Increasing the bias current also increases the amount of attenuation. The current sinks 301 and 303 defining the bias current of the transconductance stage 103 may also be implemented to be electronically controlled in a similar manner to vary the gain and thus the transconductance of the overall variable transconductance amplifier 100. Of course, the bias current of wither or both of the variable attenuator and transconductance stages may be controlled to adjust gain and transconductance as desired. In this manner, the maximum useful input voltage may be increased while maintaining linearity.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the present invention as defined by the appended claims.

What is claimed is:

1. A variable transconductance amplifier, comprising:
   a variable attenuator, comprising:
   first and second differential to single-ended transconductance stages each biased by a respective one of first and second current devices, and each having a first control terminal for collectively receiving a differential input voltage signal, and each having a second control terminal that develops a current signal; and
   at least one reactive element coupled between the second control terminals of the first and second differential to single-ended transconductance stages; and
   a transconductance stage, comprising:
   a first differential pair having first and second control terminals and first and second output terminals, wherein the first and second control terminals of the first differential pair are coupled to the first and second control terminals, respectively, of the first differential to single-ended transconductance stage of the variable attenuator;
   a second differential pair having first and second control terminals and first and second output terminals, wherein the first and second control terminals of the second differential pair are coupled to the first and second terminals, respectively, of the second differential to single-ended transconductance stage of the variable attenuator; and
   wherein the first output terminal of the first differential pair is coupled to the second output terminal of the second differential pair and forms a first polarity of a differential output current signal and wherein the first output terminal of the second differential pair is coupled to the second output terminal of the first differential pair and forms a second polarity of the differential output current signal.

2. The variable transconductance amplifier of claim 1, wherein the at least one reactive element comprises a resistor.

3. The variable transconductance amplifier of claim 1, wherein the at least one reactive element comprises a combination of elements having a predetermined frequency response.

4. The variable transconductance amplifier of claim 1, wherein the first and second current devices are electronically controllable to adjust the gain of the variable attenuator and to adjust the maximum allowable input voltage of the differential input voltage while maintaining linearity.

5. The variable transconductance amplifier of claim 1, wherein the first and second differential pairs are each biased by at least one current device that is electronically controllable to adjust the transconductance between the differential input voltage signal and the differential output current signal.

6. The variable transconductance amplifier of claim 1, wherein the first and second differential pairs are biased by third and fourth current devices, respectively, and wherein the first, second, third and fourth current devices are controllable to adjust the overall transconductance between the differential input voltage signal and the differential output current signal.

7. The variable transconductance amplifier of claim 1, wherein the first and second differential pairs of the transconductor stage each have a bias terminal, and wherein the bias terminals of the first and second differential pairs are coupled together.

8. The variable transconductance amplifier of claim 7, further comprising:
   a third current device coupled to the common bias terminals of the first and second differential pairs.

9. The variable transconductance amplifier of claim 1, wherein the first and second differential to single-ended transconductance stages of the variable attenuator each comprise:
   a differential pair of transistors including a diode-coupled transistor;
   a respective one of the first and second current devices comprising a current sink coupled to the differential pair; and
   a current mirror coupled to the differential pair.

10. The variable transconductance amplifier of claim 1, wherein the first and second differential to single-ended transconductance stages of the variable attenuator each comprise:
    a differential pair of transistors including a first transistor coupled to a voltage supply signal and a diode-coupled transistor;
    a respective one of the first and second current devices comprising a current sink coupled to the differential pair; and
    a current source coupled to the diode-coupled transistor of the differential pair, the current source sourcing a current that is proportional to the current developed by a corresponding current sink.

11. The variable transconductance amplifier of claim 1, wherein the first and second differential to single-ended transconductance stages of the variable attenuator each comprise:
    a differential pair of transistors including a diode-coupled transistor;

a respective one of the first and second current devices comprising a current sink coupled to the differential pair;

first and second current sources, each coupled to source current to a respective one of the transistors of the differential pair, the current sources each sourcing a current that is proportional to the current developed by a corresponding one of the first and second current sinks.

12. The variable transconductance amplifier of claim 11, wherein the differential pairs of transistors of the first and second differential to single-ended transconductance stages are cross-coupled.

13. A variable transconductance amplifier, comprising:
a variable attenuator, comprising:
   a first differential to single-ended transconductance stage, biased by a first current device and having first and second control terminals, that develops a current signal via the second control terminal;
   a second differential to single-ended transconductance stage, biased by a second current device and having first and second control terminals, that develops a current signal via the second control terminal; and
   a reactive circuit coupled between the second control terminal of the first differential to single-ended transconductance stage and the second control terminal of the second differential to single-ended transconductance stage;
   wherein the first control terminal of each of the first and second differential to single-ended transconductance stages receive a differential input voltage signal; and
a transconductance stage, comprising:
   a first differential pair, biased by a third current device and having first and second control terminals and first and second output terminals, wherein the first and second control terminals of the first differential pair are coupled to the first and second control terminals, respectively, of the first differential to single-ended transconductance stage of the variable attenuator;
   a second differential pair, biased by a fourth current device and having first and second control terminals and first and second output terminals, wherein the first and second control terminals of the second differential pair are coupled to the first and second control terminals, respectively, of the second differential to single-ended transconductance stage of the variable attenuator; and
   wherein the first output terminal of the first differential pair is coupled to the second output terminal of the second differential pair and forms a first polarity of a differential output current signal and wherein the first output terminal of the second differential pair is coupled to the second output terminal of the first differential pair and forms a second polarity of the differential output current signal.

14. The variable transconductance amplifier of claim 13, wherein the variable attenuator comprises:
   a first current mirror, coupled to a voltage supply signal, having an input and an output;
   a second current mirror, coupled to the voltage supply signal, having an input and an output;
   the first and second current devices each comprising a current sink referenced to a common reference signal;
   a first bipolar junction transistor having a base receiving a first polarity of the differential input voltage signal, a collector coupled to the input of the first current mirror and an emitter coupled to the first current sink;
   a second bipolar junction transistor having a base receiving a second polarity of the differential input voltage signal, a collector coupled to the input of the second current mirror and an emitter coupled to the second current sink; and
   a third bipolar junction transistor having a base coupled to a first end of the reactive element, a collector coupled to its base and to the output of the first current mirror, and an emitter coupled to the emitter of the first transistor;
   a fourth bipolar junction transistor having a base coupled to a second end of the reactive element, a collector coupled to its base and to the output of the second current mirror, and an emitter coupled to the emitter of the second transistor.

15. The variable transconductance amplifier of claim 14, wherein the first, second, third and fourth transistors are NPN bipolar junction transistors.

16. The variable transconductance amplifier of claim 14, wherein the first and second current sinks are electronically controllable.

17. The variable transconductance amplifier of claim 14, wherein the first and second current mirrors each comprise:
   a first PNP bipolar junction transistor having an emitter coupled to the voltage supply signal, and a base and a collector coupled together and forming an input terminal of the respective current mirror; and
   a second PNP bipolar transistor having an emitter coupled to the voltage supply signal, a base coupled to the base of the first PNP transistor and a collector forming an output of the respective current mirror.

18. The variable transconductance amplifier of claim 17, further comprising:
   a first capacitor coupled between the collector of a second PNP transistor of the first current mirror and to the common bases of the first and second PNP transistors of the second current mirror; and
   a second capacitor coupled between the collector of a second PNP transistor of the second current mirror and to the common bases of the first and second PNP transistors of the first current mirror.

19. The variable transconductance amplifier of claim 13, wherein the reactive circuit comprises a resistor.

20. The variable transconductance amplifier of claim 13, wherein the reactive circuit comprises at least one element coupled to provide a predetermined frequency response.

21. The variable transconductance amplifier of claim 13, wherein the variable attenuator comprises:
   a first current source having an input coupled to a voltage supply signal and an output;
   a second current source having an input coupled to a voltage supply signal and an output;
   the first and second current devices each comprising a current sink referenced to a common reference signal;
   a first bipolar junction transistor having a base receiving a first polarity of the differential input voltage signal, a collector coupled to the voltage supply signal and an emitter coupled to the first current sink;
   a second bipolar junction transistor having a base receiving a second polarity of the differential input voltage signal, a collector coupled to the voltage supply signal and an emitter coupled to the second current sink;
   a third bipolar junction transistor having a base coupled to a first end of the reactive element, a collector coupled to its base and to the output of the first current source, and an emitter coupled to the emitter of the first transistor;

a fourth bipolar junction transistor having a base coupled to a second end of the reactive element, a collector coupled to its base and to the output of the second current source, and an emitter coupled to the emitter of the second transistor.

22. The variable transconductance amplifier of claim 21, wherein the first and second current sinks each sink approximately the same amount of current as each other and wherein the first and second current sources each source approximately the same amount of current as each other.

23. The variable transconductance amplifier of claim 22, wherein the first and second current sources each source approximately half the current of the first and second current sinks.

24. The variable transconductance amplifier of claim 13, wherein the variable attenuator comprises:

first, second, third and fourth current sources, each having an input coupled to a voltage supply signal and an output;

the first and second current devices each comprising a current sink referenced to a common reference signal;

a first bipolar junction transistor having a base receiving a first polarity of the differential input voltage signal, a collector coupled to the output of the first current source and an emitter coupled to the first current sink;

a second bipolar junction transistor having a base receiving a second polarity of the differential input voltage signal, a collector coupled to the output of the fourth current source and an emitter coupled to the second current sink;

a third bipolar junction transistor having a base coupled to a first end of the reactive element, a collector coupled to its base and to the outputs of each of the second and fourth current sources, and an emitter coupled to the emitter of the first transistor;

a fourth bipolar junction transistor having a base coupled to a second end of the reactive element, a collector coupled to its base and to the outputs of each of the third and fourth current sources, and an emitter coupled to the emitter of the second transistor.

25. The variable transconductance amplifier of claim 24, wherein the first and second current sinks each sink approximately the same amount of current as each other and wherein the first, second, third and fourth current sources each source approximately the same amount of current as each other.

26. The variable transconductance amplifier of claim 25, wherein the first, second, third and fourth current sources each source approximately half the current of the first and second current sinks.

27. The variable transconductance amplifier of claim 13, wherein the transconductance stage comprises:

the third and fourth current devices each comprising a current sink referenced to a common reference signal;

a first bipolar junction transistor having an emitter coupled to the third current sink, a base receiving the first polarity of the differential input voltage signal and a collector that develops a first polarity of the differential output voltage signal; and a second bipolar transistor having an emitter coupled to the emitter of the first transistor, a base forming the second control terminal of the first differential pair and a collector;

a third bipolar junction transistor having an emitter coupled to the fourth current sink, a base receiving the second polarity of the differential input voltage signal and a collector coupled to the collector of the second transistor for developing a second polarity of the differential output voltage signal; and a fourth bipolar junction transistor having an emitter coupled to the emitter of the third transistor, a base forming the second control terminal of the second differential pair and a collector and a collector coupled to the collector of the first transistor for developing the first polarity of the differential output voltage signal.

28. The variable transconductance amplifier of claim 27, wherein the first, second, third and fourth transistors are NPN bipolar junction transistors.

29. The variable transconductance amplifier of claim 27, wherein the emitters of the first, second, third and fourth transistors are coupled together.

30. The variable transconductance amplifier of claim 29, wherein the third and fourth current sinks comprise a single, electronically controllable current sink.

31. A variable transconductance amplifier, comprising:

a transconductance stage including first and second differential pairs each having current-controlled differential outputs that are cross-coupled together to form a differential current output, the first and second differential pairs each having first and second inputs; and a variable attenuator including first and second differential to single-ended transconductance stages, each having a first terminal for collectively receiving a differential input voltage signal and a second terminal, wherein the second terminals are coupled together through a reactive element, wherein the first and second terminals of the first differential to single-ended transconductance stage are coupled to the first and second inputs of the first differential pair, respectively, and wherein the first and second terminals of the second differential to single-ended transconductance stage are coupled to the first and second inputs of the second differential pair, respectively.

32. The variable transconductance amplifier of claim 31, wherein the first and second differential to single-ended transconductance stages of the variable attenuator are biased by at least one electronically controllable current device.

33. The variable transconductance amplifier of claim 31, wherein the first and second differential pairs of the transconductance stage are biased by at least one electronically controllable current device.

* * * * *